United States Patent

Lien et al.

[11] Patent Number: 5,310,700
[45] Date of Patent: May 10, 1994

[54] CONDUCTOR CAPACITANCE REDUCTION IN INTEGRATED CIRCUITS

[75] Inventors: Chuen-Der Lien, Mountain View; Jimmy J. Lee, Palo Alto; Daniel J. L. Liao, Pleasanton; Joe F. Santandrea, Los Altos Hills, all of Calif.

[73] Assignee: Integrated Device Technology, Inc., Santa Clara, Calif.

[21] Appl. No.: 37,268

[22] Filed: Mar. 26, 1993

[51] Int. Cl.$^5$ ............................................. H01L 21/44
[52] U.S. Cl. .................................. 437/195; 437/162; 437/182; 437/183; 437/192
[58] Field of Search ............... 437/195, 190, 192, 231, 437/182, 183

[56] References Cited

U.S. PATENT DOCUMENTS

| | | | |
|---|---|---|---|
| 4,502,210 | 3/1985 | Okumura et al. | 437/195 |
| 4,735,913 | 4/1988 | Hayes | 437/192 |
| 4,801,560 | 1/1989 | Wood et al. | 437/195 |
| 4,859,633 | 8/1989 | Bayraktaroglu | 437/192 |
| 4,986,878 | 1/1991 | Malazgirt et al. | 437/231 |
| 5,192,715 | 3/1993 | Sliwa, Jr. et al. | 437/195 |
| 5,217,926 | 6/1993 | Langley | 437/231 |

*Primary Examiner*—Brian E. Hearn
*Assistant Examiner*—Kevin M. Picardat
*Attorney, Agent, or Firm*—Thomas E. Schatzel

[57] ABSTRACT

A passive semiconductor structure for reduction of the mutual capacitance between parallel conductors, with two parallel conductors separated from a substrate by a first dielectric layer and covered by a second dielectric layer. The second dielectric layer having a cavity formed between these conductors, whereby the effective relative dielectric constant of the medium between these conductors is reduced.

6 Claims, 2 Drawing Sheets

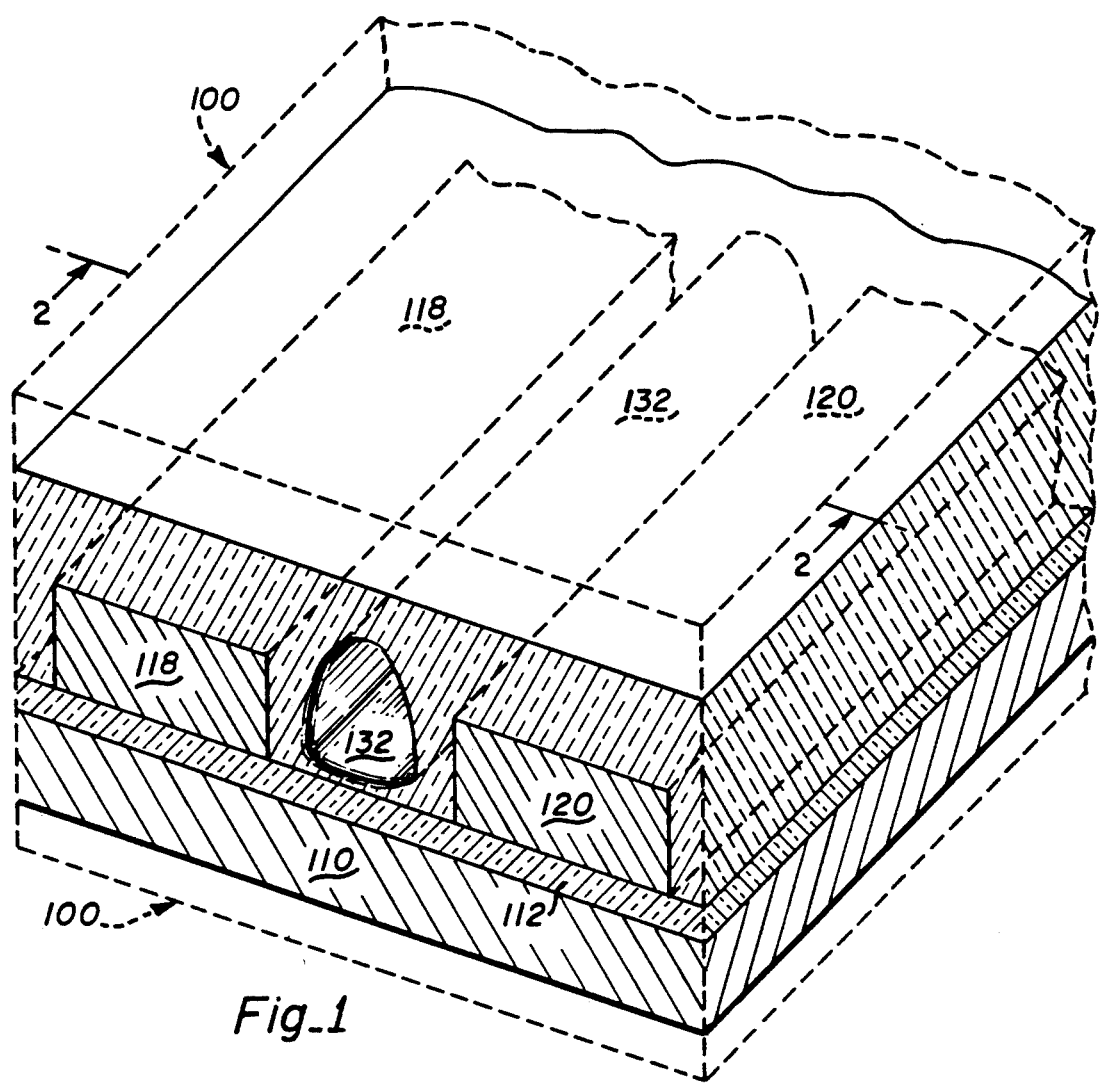
Fig_1
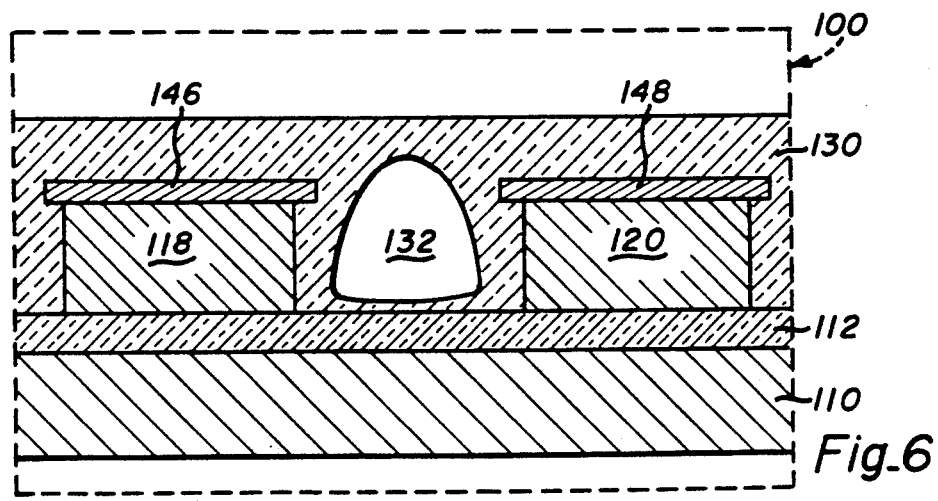
Fig_6

CONDUCTOR CAPACITANCE REDUCTION IN INTEGRATED CIRCUITS

BACKGROUND OF THE INVENTION

1. Field of the Invention

The present invention relates generally to semiconductor processing and more specifically to structures and methods to reduce the capacitance of conductors on integrated circuits for an increase of switching speed and a reduction in cross-talk between conductors.

2. Description of the Prior Art

The increase in component density and need for ever increasing switching speed in integrated circuits invites a reevaluation of process developments and other methods to reduce detrimental parameters impeding these requirements, like distributed capacitances.

Generally, the performance of integrated circuits semiconductors is dependent on switching speed and noise immunity. The transition time from one logic state (one defined voltage level) to another logic state (another defined voltage level) is dependent on charging or discharging a circuit capacitance between these two voltage levels. The charging or discharging voltage versus time follows a curve given by the basis of the natural logarithm, with an exponent comprising the elapsed time "t" divided by a time constant "RC", where "R" is the resistance of the charging conductor and "C" is the capacitance of the charged element. The switching time to cross the gray, undefined region between logic states to the other logic level is about one time constant.

For a parallel plate capacitor the capacitance is C=(area times eO times eR)/d, where "eO" is the absolute permittivity in vacuum, "eR" is the relative permittivity of the medium between capacitor plates, and "d" is the distance separating the capacitor plates. The relative permittivity "eR" of vacuum or air is 1.0 by definition, while that of silicon dioxide is 3.9, for example.

Regarding a decrease of the time constant "RC", one can consider first the specific resistivity of a conductor per unit length lines on an integrated circuit. Resistivity is a material-specific factor which together with the geometry of the conductor results in its resistance. Conductors comprise metal (e. g. aluminum) lines with a relatively low resistivity or doped polysilicon lines. Within processing constraints one can increase the doping level of the polysilicon in order to decrease its specific resistivity.

The distributed capacitance per unit length of conductor is the other critical factor for a reduction of the time constant "RC". It can be decreased by using a material with a relative permittivity approaching the value of one for the medium surrounding the conductors. The distributed capacitance consists of two portions:

a) the (vertical) "substrate capacitance", which can be decreased, for example, by increasing the thickness of the insulator between conductor and substrate; and b) the (horizontal) "mutual capacitance" between conductors in close proximity, which results in undesirable capacitive coupling between conductors, called crosstalk. It can be decreased, for example, by increasing the distance between conductors.

However, these approaches for decreasing the distributed capacitance are not practical design options.

SUMMARY OF THE PRESENT INVENTION

It is an object of the present invention to provide means to decrease the mutual capacitance component of the distributed capacitance by decreasing the relative dielectric constant between conductors.

Briefly, a preferred embodiment of the present invention includes semiconductor structures and methods for their implementation. Two adjacent conductors are covered by an insulating film, whose growth is directed to generate an elongated cavity between said conductors. There is a partial reduction of the effective relative dielectric constant along the pathway of the electric field lines within the medium (for example, a silicon dioxide layer with eR=3.9) between conductors by providing. a cavity (with eR=1.0) between conductors by semiconductor process means.

An advantage of the present invention is an increase in switching speed due to a decrease in horizontal distributed capacitance of a conductor in reference to its environment.

Another advantage of the present invention is a reduction in cross-talk between conductors resulting in improved noise immunity.

Another advantage of the present invention is that the reduction in cross-talk allows for a reduction of the gray zone between the voltage levels of the logic state resulting in the possibility of a reduction of the supply voltage level. This is a important aspect for the development of reduced supply voltage circuits for battery operated equipment like laptop computers.

Another advantage of the present invention is that the processing steps required for implementation are compatible with present processing technology.

These and other objects and advantages of the present invention will no doubt become obvious to those of ordinary skill in the art after having read the following detailed description of the preferred embodiments which are illustrated in the various drawing FIGURES.

BRIEF DESCRIPTION OF THE DRAWINGS

FIG. 1 is an enlarged cross-sectional perspective view of a device of the present invention;

FIG. 6 is an illustration of the cross-section of a finished refined version of the structure of FIG. 4.

DETAILED DESCRIPTION OF THE PREFERRED EMBODIMENTS

Figure 2:
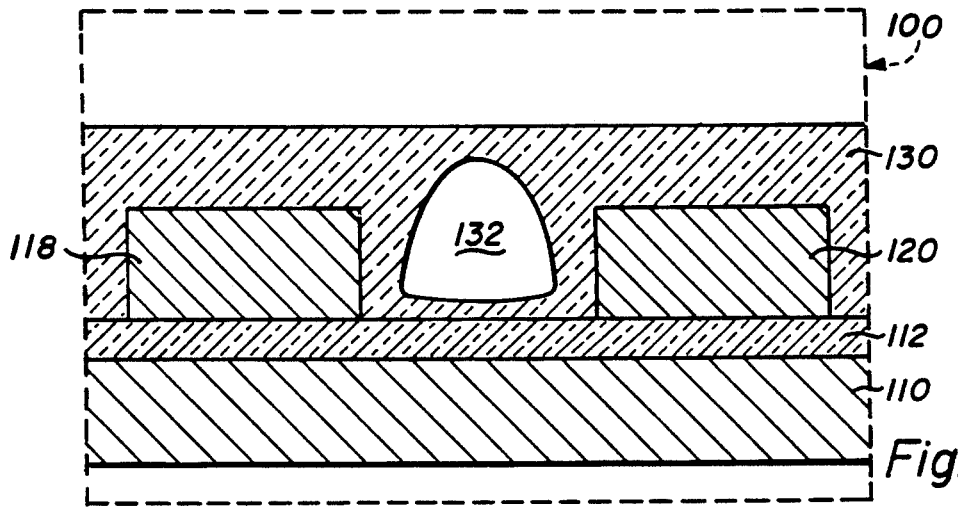
FIG. 2 is an illustration of the cross-section of the structure of the preferred embodiment, taken along the line 2—2 of FIG. 1.

FIG. 1 is an enlarged cross-sectional perspective view of a device of the present invention, illustrating a semiconductor structure referred to by the general reference character 100. The structure 100 includes active (semiconductor junctions) and passive (conductors, contacts and insulating layers) components. Active components are not a subject of the present invention and are not shown. Also, of the passive components only two of a plurality of parallel conductors are depicted.

The device 100 includes a semiconductor wafer 110, covered by a first insulating medium 112. The medium 112 serves as the support for a plurality of conductors, of which only two, a conductor 118 and a conductor 120, are depicted. The two conductors 118 and 120 and the medium 112 are covered by a second insulating medium 130. A cavity 132 in medium 130 is located between the conductors 118 and 120.

FIG. 2 illustrates the basic structure of the present invention as a cross-section along lines 2—2 of FIG. 1. On top of semiconductor substrate 110, e.g. a silicon wafer, the medium 112 is deposited, which serves as an insulator for conductors 118 and 120. This medium 112 may be a generated silicon dioxide. The medium 130 covers these conductors and forms the elongated cavity 132 between these conductors.

Figure 3:
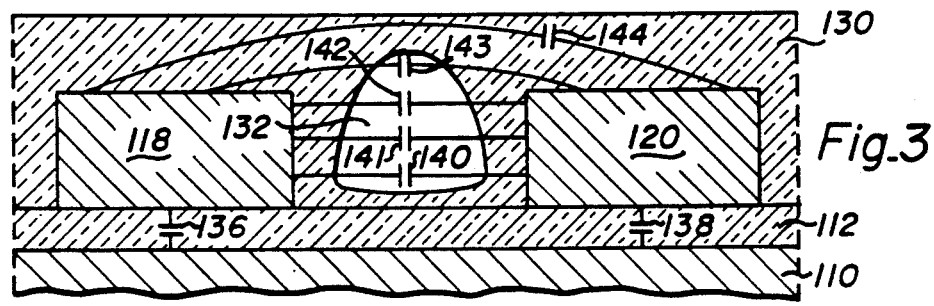
FIG. 3 is an illustration of the distributed capacitance components of the structure of FIG. 2.

FIG. 3 is a simplified drawing illustrating the components of the total capacitance of the conductors 118 and 120. Substrate capacitances 136 and 138 are individual capacitances between conductors 118 and 120 and substrate 110, respectively, with the medium 112 being the dielectric medium. A mutual capacitance between conductors 118 and 120 comprises distributed capacitive components 140, 141, 142, 143, and 144.

Assuming the two conductors are at different voltages, according to the laws of physics the majority of the electric field lines span the shortest distance between them, namely between their facing sides. A minor portion of the electric field lines emanate from and terminate at the upper surfaces of the conductors.

One factor contributing to the mutual capacitance portion of the total distributed capacitance is the relative dielectric constant "eR" of the medium 130 between the conductors 118 and 120. The cavity 132 at such location provides for a reduced effective "eR" and consequently a reduced capacitance between conductors 118 and 120, since the path of the majority of electric field lines would extend mostly within the cavity 132 (with an eR of 1.0) and only for short distances within medium 130 (with a higher eR, typically 3.9 for silicon dioxide). The shape of the cavity 132 is widest nearest to medium 112 and to the side faces of the conductors 118 and 120, where most of the electric field lines cross over as represented by capacitances 140, 141 and 142 in FIG. 3. Since only a small portion of the field lines emanate from the top surfaces of the conductors 118 and 120, their contribution to the mutual capacitance is small, with their path crossing only a short distance across cavity 132 at its apex (represented by capacitance 143) or even being totally within the medium 130 (with its higher "eR") and represented by capacitance 144.

In manufacturing, after all required integrated circuit processing steps the semiconductor substrate 110 is usually covered by the medium 112. The medium 112 serves as an insulating layer and is covered by a conducting medium, e.g. aluminum or doped polysilicon, whose resistivity depends on its doping level. Conductors 118 and 120 are then formed by masking and etching. The medium 130, for example a low temperature silicon dioxide layer, is deposited during one of the last processing steps to cover the structure in order to seal it from contamination. The forming of the low temperature silicon dioxide layer is a process whereby, for example, silane gas SiH4 and oxygen O2 form a silicon dioxide SiO2 layer at a temperature (about 600 C.), that is far below 900 C. where the doped semiconductor diffusion profiles would be disturbed. By certain processing steps the growth of this medium can be controlled such that lateral protrusions are formed on top of the respective conductors. With increasing layer thickness these protrusions coalesce into the closed surface layer 130 which includes the elongated cavity 132 of triangular or gothic-arch shaped cross-section between conductors 118 and 120.

Figure 4:
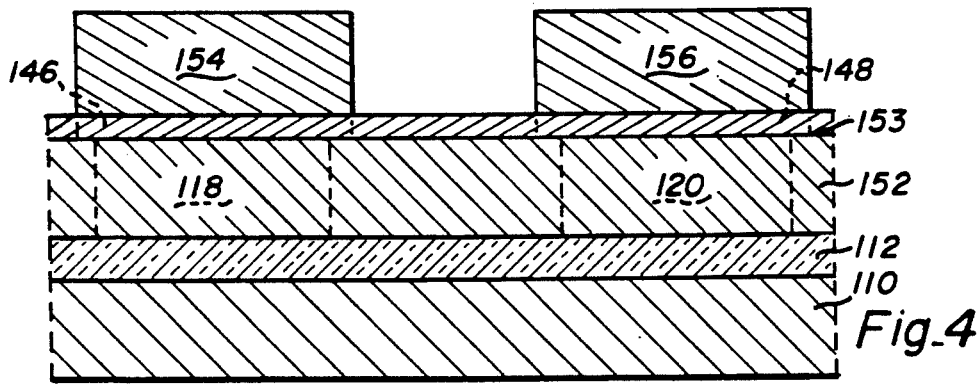
FIG. 4 is an illustration of an initial processing step in manufacturing of a refined version of the structure of FIG. 2.

FIG. 4 illustrates some of the manufacturing steps of a more refined structure 100. On top of semiconductor substrate 110 the medium 112 is deposited, onto which the conductive medium 152 is deposited. This medium 152 is covered by a thin layer of a third medium 153, which can be insulating or conductive, for example a low temperature silicon dioxide or silicon nitride, which in turn is covered by a layer of photo-resist. After masking, exposing and developing photoresist strips 154 and 156 remain above the planned conductors 118 and 120, respectively.

Figure 5:
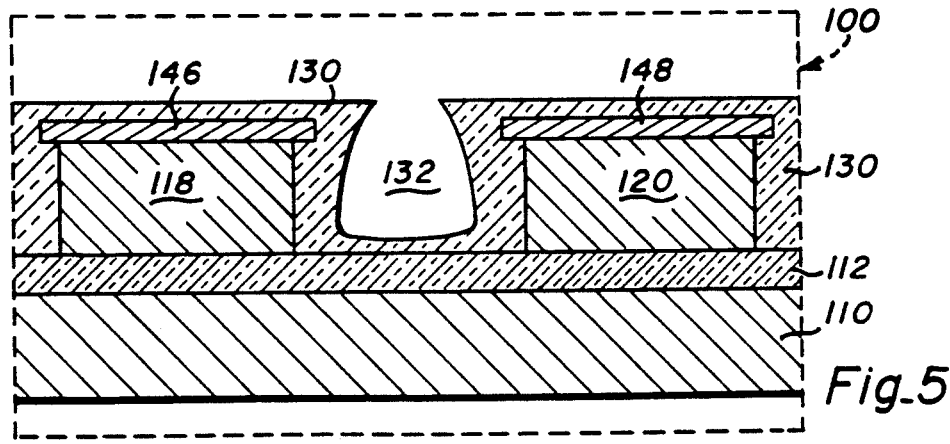
FIG. 5 is an illustration of an intermediate point in time during the manufacturing of the refined structure of FIG. 4.

FIG. 5 shows that after etching the medium 150 to generate strips 146 and 148 and after over-etching the conductive layer 152, conductors 118 and 120 are created and covered by third medium strips 146 and 148. Photoresist stips 154 and 156 are removed by a photoresist stripper solvent. FIG. 5 also illustrates how a controlled growth of the second medium 130 generates protrusions near the edges of the strips 146 and 148 and near the sidewalls of the conductors 118 and 120.

FIG. 6 shows the final structure 100. As the thickness of the layer of medium 130 increases, the protrusions near the edges of strips 146 and 148, as shown in FIG. 5, coalesce into a closed layer of medium 130 with a flat continuous surface, thus generating the cavity 132.

The structures described in this preferred embodiment serve to reduce the mutual capacitance and thus the cross-talk between conductors 118 and 120. The resulting increased noise immunity can serve to decrease the gray, undefined zone between the voltage levels representing the logic states of switching circuits. This in turn may be a substantial contributing factor in allowing a reduced supply voltage level, which is a design goal for extending operating hours for battery-operated equipment including lap-top computers. The steps for manufacturing of the structures described above including the generation of the cavity 132 are compatible with commonly used semiconductor processing steps.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for capacitance reduction between a first conductor (118) and a second conductor (120) located on top of a semiconductor substrate (110) and comprising the steps of a) depositing a first insulating medium (112) on top of the substrate;

b) depositing a conducting medium (152) on top of the first medium;

c) masking and etching the conducting medium to obtain a first conductor (118) and a second conductor (120); and d) growing a second insulating medium (130) on top of the substrate and the conductors such that the growing medium coalesces in the vicinity of the top of the conductors leaving an elongated cavity (132) with an apex between the conductors.

2. The method as in claim 1, wherein the first insulating medium comprises silicon dioxide.

3. The method as in claim 1, wherein the second insulating medium comprises silicon dioxide.

4. A method for capacitance reduction between a first conductor (118) and a second conductor (120) on a semiconductor substrate (110), comprising the steps of a) depositing a first dielectric layer (112) on top of the semiconductor substrate;

b) depositing a conductive layer (152) on top of the first dielectric layer;

c) depositing a third conductive or insulating layer (150) on top of the conducting layer;

d) depositing a photo resist layer on top of the third layer;

e) masking, developing and baking the photo resist layer to obtain photo resist structures (154 and 156) at the location of and wider than a first designed conductor (118) and a second designed conductor (120);

f) etching the third layer to obtain a first strip (146) and a second strip (148) of the third layer (153);

g) overetching the conducting layer (152) to obtain the first conductor (118) and the second conductor (120);

h) depositing a second dielectric layer (130) on top of the first conductor (118) and the second conductor (120) coalescing in the vicinity of the top of the first conductor and the second conductor to form an elongated cavity (132) with an apex.

5. The method of claim 4, wherein the third layer comprises low temperature silicon dioxide.

6. The method of claim 4, wherein the third layer comprises low temperature silicon nitride.

* * * * *